United States Patent [19]
Eckhardt et al.

[11] Patent Number: 6,058,488
[45] Date of Patent: May 2, 2000

[54] METHOD OF REDUCING COMPUTER MODULE CYCLE TIME

[75] Inventors: James Patrick Eckhardt, Pleasant Valley; Paul David Muench, Poughkeepsie; Wiren D. Becker, Hyde Park; Timothy Gerard McNamara, Fishkill, all of N.Y.

[73] Assignee: International Business Machines Corporation, Armonk, N.Y.

[21] Appl. No.: 09/023,176

[22] Filed: Feb. 13, 1998

[51] Int. Cl.[7] .................................................. G06F 1/04
[52] U.S. Cl. ............................................... 713/503
[58] Field of Search .................... 713/500, 503, 713/600

[56] References Cited

U.S. PATENT DOCUMENTS

| | | | |
|---|---|---|---|
| 5,604,466 | 2/1997 | Dreps et al. | 331/113 R |
| 5,731,965 | 3/1998 | Cheng et al. | 363/41 |

OTHER PUBLICATIONS

"Phase–Locked–Loop Control of a Tuning Fork Oscillator" IBM Technical Disclosure Bulletin, vol. 22, No. 3, Aug. 1979, pp. 1088–1090.

*Primary Examiner*—Dennis M. Butler
*Attorney, Agent, or Firm*—Lynn L. Augspurger

[57] ABSTRACT

A reduction of multichip module computer system cycle time is achieved by using a voltage regulator for power supply noise attenuation to reduce jitter. The circuit for doing this includes an active filter network circuit for use in the multichip module of a computer system which generates a quiet analog VDD coupled directly to ground by using the low impedance power supply distributions which already exist in the module. The active filter network permits taking the power supply voltage from the module and stepping it down to a voltage needed by a phased lock loop via an active filter, said active filter comprising an op-amplifier and a source follower and a large value on module capacitor for a resistor network. The capacitor and resistor network acts as a filter with a large time constant where noise appearing on VDD,MOD is completely attenuated by this high value capacitor and resistor network part of our active filter network.

9 Claims, 2 Drawing Sheets

METHOD OF REDUCING COMPUTER MODULE CYCLE TIME

FIELD OF THE INVENTION

This invention is related to reducing computer module cycle times, and particularly to a method for reducing cycle time by greatly reducing jitter and to a voltage regulator for power supply attenuation to analog circuits for such purpose.

BACKGROUND OF THE INVENTION

In an effort to continue to increase computer system speed, it would be desirable to improve the multi-chip modules cycle time and therefore to increase speed. Multi-chip modules cycle time is determined in part by the clock speed, and in recent years International Business Machines Corporation has used phase locked loops for clock generation in the microprocessor circuits used in computer system multi-chip modules. It would be desirable to increase system speed while maintaining use of phased locked loops because phased locked loops allow a lower frequency signal to be distributed throughout the computer system because it frequency multiplies while maintaining a constant phase relationship between clock in the system.

SUMMARY OF THE INVENTION

Our invention provides an active filter network circuit for use in a multichip module of a computer system which generates a quiet analog VDD coupled directly to ground by using the low impedance power supply distributions which already exist in the module. Our active filter network permits taking the power supply voltage from the module and stepping it down to a voltage needed by a phased locked loop via an active filter, said active filter comprising an op-amplifier and a source follower.

A capacitor and resistor network network acts as a filter with a large time constant where noise appearing on VDD, MOD is completely attenuated by a large on module capacitor and on chip resistor network part of our active filter network.

These and other improvements are set forth in the following detailed description. For a better understanding of the invention with advantages and features, refer to the description and to the drawings.

BRIEF DESCRIPTION OF THE DRAWINGS

FIG. 1 shows schematically an overview of the preferred embodiment which uses the existing power supply distribution planes in a multichip module MCM having low impedance power supply distributions to chips on a substrate in the MCM and particularly shows a schematic of our filter network; while

DETAILED DESCRIPTION OF THE INVENTION

In the course of improving phase locked loops we have derived a method and circuit which increases system speed which we will describe which reduces jitter which in turn directly reduces cycle time.

The biggest problem with PLLs is jitter. Jitter refers to the PLL's error; its difference from the ideal clock. PLL jitter adds to to clock skew which adds right to cycle time. Any reduction in jitter subtracts from the chips cycle time. In PLLs, the main source of jitter is power supply noise. A PLLs jitter will be specified in picoseconds of jitter per millivolt of noise. We have solved the problem with a method and circuit which filters out noise for a critical range of frequencies.

Before considering our preferred embodiments in detail, it may be worthwhile to illustrate, by way of example, a little history. Historically, PLL designers used a separate power supply, an analog VDD. This was brought in as an I/O and removed all the chips switching activity from the PLL's VDD. However, the PLL still sees a noisy ground and the analog VDD being a higher impedance connection is subject to much more coupled noise. In reality, the analog VDD solution has just pushed off the problem to the user of the PLL.

Figure 1:
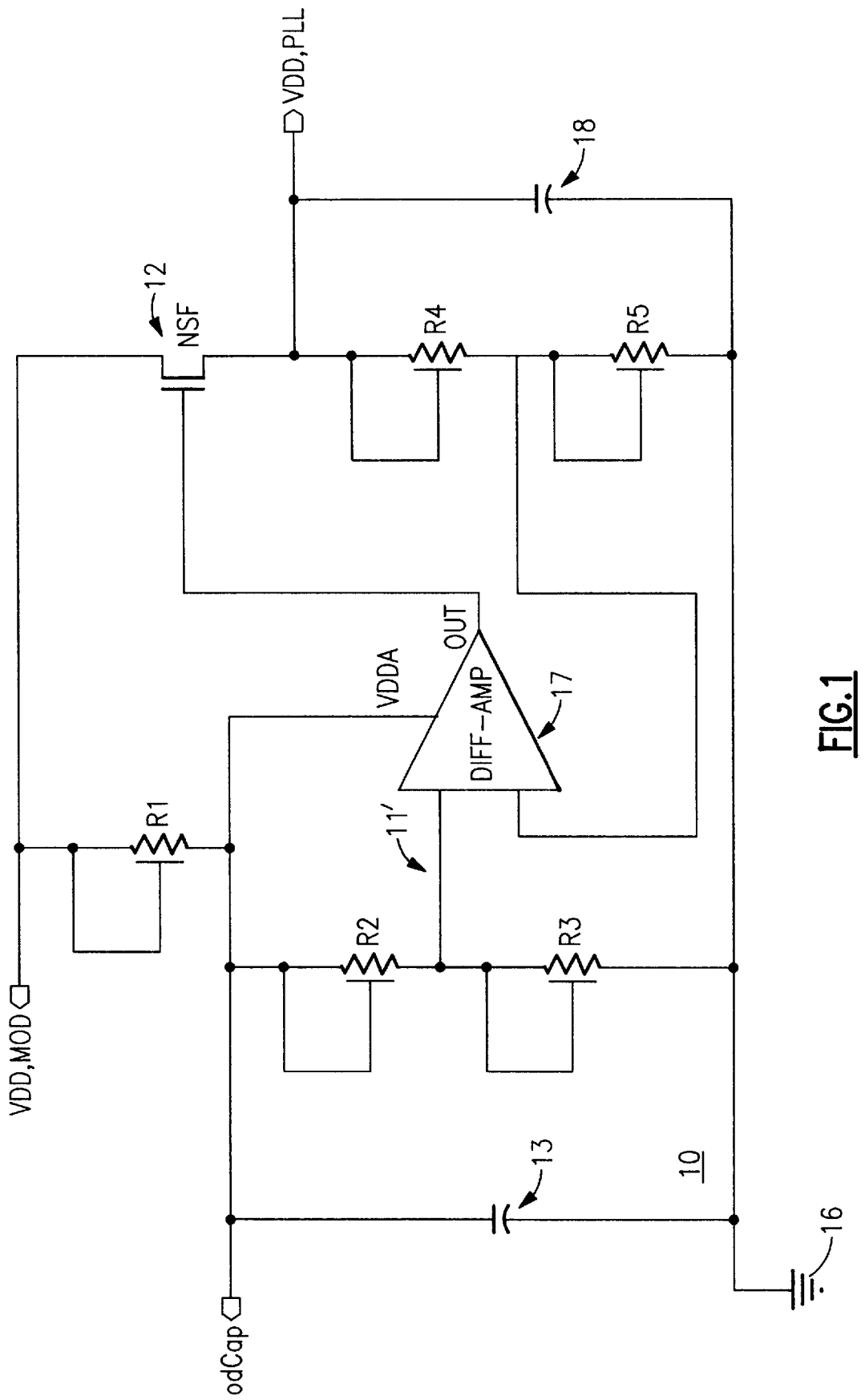

Turning now to our invention in greater detail, it will be seen from FIG. 1 which illustrates our preferred embodiment which uses the existing power supply distribution planes in the MCM or multichip module. This does two things; it bases the PLL voltage on two good power supplies and second, this source of good power supplies has no sources of noise (bad voltage generator, coupled noise, reflections . . . ) when using our preferred embodiment.

In accordance with our preferred embodiment illustrated in FIG. 1, we build here an active filter network on the chip and multi-chip module MCM which generates a quiet analog VDD coupled directly to ground by using the low impedance power supply distributions which already exist in the module.

Figure 2:
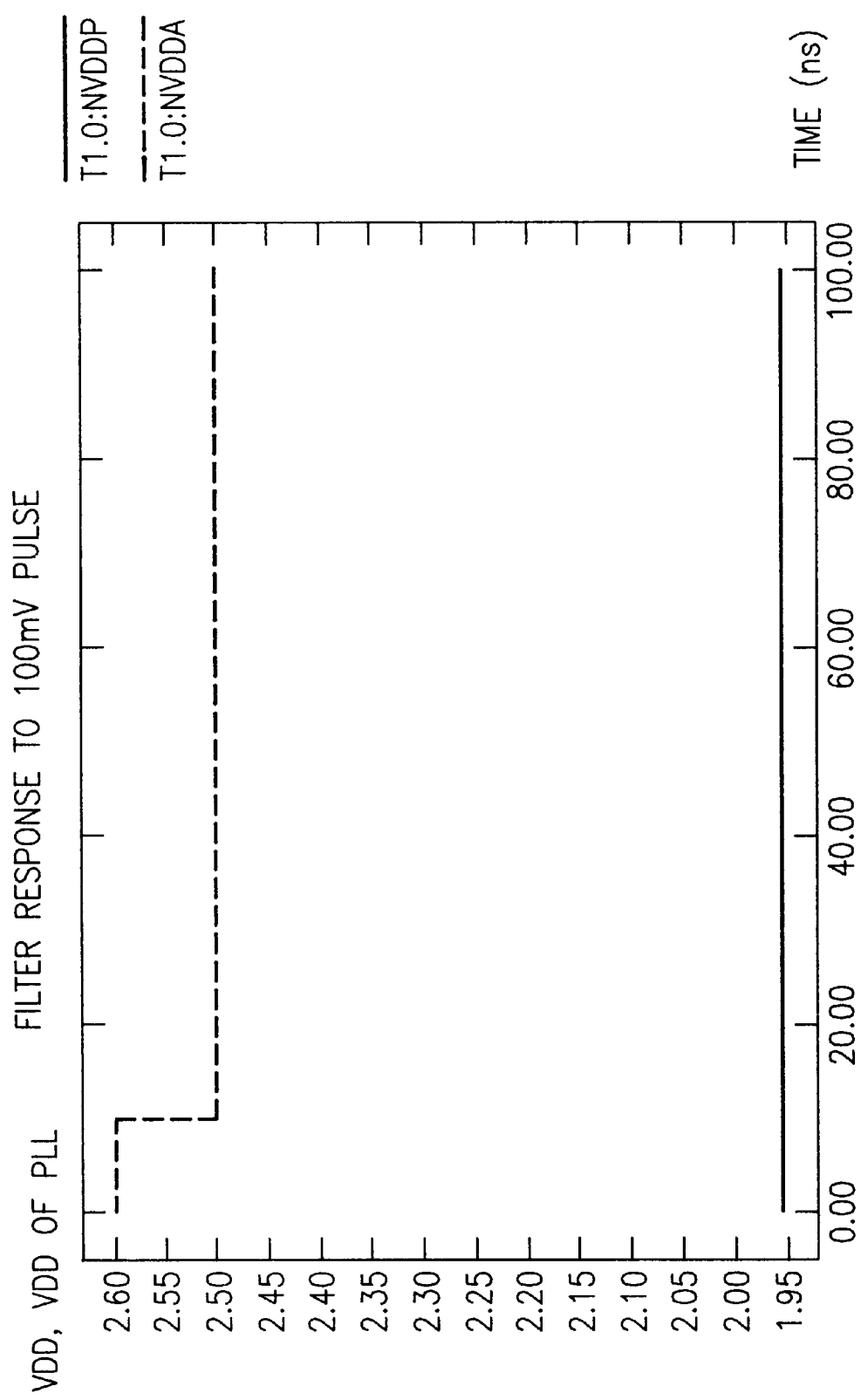
FIG. 2 shows our PLL circuit's response to a 100 mV step on VDD.

The design, shown in FIG. 1, takes the 2.5V supply from the module and steps it down to the 1.8V needed by the PLL via an active filter. The chip actually provides both a low level filter using an on-chip capacitor 18 and in addition, an active filter with a large time constant where noise appearing on a source analog voltage input VDD,MOD is completely attenuated by a large on module discrete capacitor and on chip resistor circuit to provide the combination of a high value active filter where capacitance can be as high as 180 to 200 nF or more with a 200 ns cutoff. The active filter consists of an op-amplifier 17, a source follower 12 and a 200 nF large on module discrete capacitor 13 mounted on the module 10 (the circuit of FIG. 1 is an on chip circuit as well as a discrete capacitor, both chip and discrete capacitor being mounted on the module 10) between the filter circuit R1,R2,R3,11,12,13,R4,R5, and 14 and ground 16. The operation is as follows. Op-amplifier 17 holds the analog VDD input to op-amplifier 17 voltage equal to a bias voltage at 11' determined by the R2, R3 resistance divider by providing the PLL current needed via the zero VT nfet source follower 12. As the PLL current of the on chip power supply changes VDD,PLL output from the active filter remains constant. The capacitor 12 and resistor R2, R3 network act as a filter with a large time constant. Noise appearing on VDD,MOD (2.5V) is completely attenuated by this network. The filter with R4,R5 resistance divider and the on-chip capacitor function as a low level filter. This the attenuation with the high level active filter shown in FIG. 2. A step voltage is applied to VDDA. The step contains frequency components from 2 GHz down to DC. The output varies by, at most 4 mV for a 100 mV pulse.

The solution has been experimentally verified. Hardware measurements made with the active filter without the capacitor show that the PLL's jitter is reduced by a factor of 5. It is anticipated that the capacitor will reduce the jitter by another factor of 4.

To translate what that means to the system. For a typical system with 100 mV of noise, the jitter goes from 400 ps to 20 ps. This is over 300 ps which one will note, in accordance with our invention, subtracts directly from cycle time.

While we have described our preferred embodiments of our invention, it will be understood that those skilled in the art, both now and in the future, may make make various improvements and enhancements which fall within the scope of the claims which follow. These claims should be construed to maintain the proper protection for the invention first disclosed.

What is claimed is:

1. A method of improving cycle speed of computer system components of a computer system multichip module having low impedance power supply distributions to chips on a substrate in the multichip module, comprising the steps of:

providing an active filter network circuit for said multi-chip module which uses the low impedance power supply distributions used by chips clocked by a phase locked loop clock generation circuit (PLL) for the module, and filtering out noise with a high level active filter circuit for a range of frequencies to reduce jitter from the chips' cycle time to directly reduce cycle speed of the computer system components of said multichip module.

2. A method of improving cycle speed according to claim 1 wherein said steps include generating a quiet analog VDD coupled directly to ground by using the low impedance power supply distributions which already exist in the module for power supply distributions to chips on said substrate in the multichip module and a large value on module capacitor.

3. A method of improving cycle speed according to claim 2 wherein said high level active filter circuit takes the power supply from the module and steps it down to the voltage needed by the phase locked loop clock generation circuit (PLL), and holding said analog VDD signal equal to a bias voltage.

4. A method of improving cycle speed according to claim 3 wherein said analog VDD is held equal to said bias voltage by providing the PLL current needed via a zero VT nfet source follower such that as phase locked loop clock generation circuit (PLL) current changes VDD, the output of the phase locked loop clock generation circuit (PLL) remains constant.

5. A method of improving cycle speed according to claim 3 wherein said active filter circuit includes a capacitor and resistor network acting as a filter with a large time constant where noise appearing on a source analog voltage input (VDD, MOD (2.5V)) is completely attenuated by this capacitor and resistor network.

6. An active filter circuit for use in a multichip module of a computer system, comprising an active filter network on a chip of said multi-chip module MCM which generates a quiet analog VDD coupled directly to ground by using the low impedance power supply distributions which already exist in the module, said active filter network including a circuit for taking the power supply voltage from the module and stepping it down to a voltage needed by a phase locked loop clock generation circuit (PLL) via an active filter in said active filter network, said active filter comprising an op-amplifier and a source follower and a high value capacitor mounted on said module between said active filter and ground.

7. An active filter circuit according to claim 6 wherein said op-amplifier holds the active filter analog VDD equal to a bias voltage by providing the phase locked loop clock generation circuit (PLL) current needed via a zero VT nfet source follower, and as the phase locked loop clock generation circuit (PLL) current changes VDD, the output of the phase locked loop clock generation circuit (PLL) remains constant.

8. An active filter circuit according to claim 7 wherein said capacitor and resistor network act as a filter with a large time constant such that noise appearing on a source analog voltage input (VDD, MOD (2.5V)) is completely attenuated by this network.

9. An active filter circuit according to claim 7 wherein said capacitor and resistor network act as a filter with a large time constant such that noise appearing on a source analog voltage input (VDD, MOD (2.5V)) is completely attenuated by this network where capacitance in the active filter is between 180 and 200 nF with a 200 ns cutoff.

* * * * *